United States Patent [19]

McKenny

[11] Patent Number: 5,276,653
[45] Date of Patent: Jan. 4, 1994

[54] FUSE PROTECTION CIRCUIT

[76] Inventor: Vernon G. McKenny, P.O. Box 4089, Breckenridge, Colo. 80424

[21] Appl. No.: 654,743

[22] Filed: Feb. 13, 1991

[51] Int. Cl.[5] .............................................. G11C 17/14
[52] U.S. Cl. ................................. 365/225.7; 307/202.1
[58] Field of Search ............... 307/202.1; 365/96, 149, 365/200, 210, 225.7

[56] References Cited

U.S. PATENT DOCUMENTS 4,695,745  9/1987  Mimoto et al. ............... 307/202.1 X
5,079,746  1/1992  Sato .................................. 365/225.7

Primary Examiner—Steven Mottola
Attorney, Agent, or Firm—Robert D. Lott

[57] ABSTRACT

A fuse protection circuit for an electrically programmable read only memory circuit consists of a fusing element such as an antifuse connected between a bitline and the drain of the access transistor, and which is susceptible to inadvertent activation due to programming voltages applied to the bitline when the access transistor is not being addressed. The fusing element is protected from such inadvertent activation by the addition of a capacitor between the drain of the access transistor and the bitline.

8 Claims, 1 Drawing Sheet

FUSE PROTECTION CIRCUIT

TECHNICAL FIELD

The present application pertains to electrically activated fuse elements, and more particularly, to protection circuitry for electrically activated fuse elements.

BACKGROUND OF THE INVENTION

Electrically programmable fuse elements are used in various electronic circuits including memory arrays, particularly in field programmable memory arrays. A field programmable memory array is essentially a read only memory which contains an array of electrically programmable fuse elements. These fuse elements have an initial impedance characteristic or state when manufactured, and can be irreversibly converted to have a second impedance characteristic by the application of a proper voltage and/or current through the fusing element. These memory arrays are field programmable in that a user can program the memory array rather than having programming information placed in the memory during the manufacturing process.

One type of electrically programmable fusing element is referred to as an antifuse and is described in U.S. Pat. No. 4,442,507 to Rosener. As manufactured the antifuse has a high resistance in parallel with a small capacitance. After being programmed (activated) the resistance changes to less than a hundred ohms. The antifuse typically can be activated by the application of approximately 10 volts at a current of 10 microamps applied for less than twenty nanoseconds.

However, in a typical memory array in which one terminal of the antifuse is floating and the other terminal of the antifuse is connected to a bit line, the combination of the voltage change on the bit line and the parasitic capacitance between the floating terminal of the antifuse and ground can provide conditions which may result in an inadvertent activation of the antifuse.

Therefore, it can be appreciated that a fuse protection circuit which protects an antifuse type of fusing element from being inadvertently activated and which occupies a small amount of chip area is highly desirable.

SUMMARY OF THE INVENTION

It is therefore an object of this invention to provide an fuse protection circuit which protects a fuse element from being inadvertently activated.

Shown in an illustrated embodiment of the invention is a fuse protection circuit for protecting an electrically programmable fusing element. The fuse element has a first impedance state when manufactured which can be changed into a second impedance state. The fusing element is used in a circuit that has a first terminal coupled to a changeable signal, and a second terminal coupled, at least part of the time, to a reference potential through a capacitance. In this circuit the fusing element is susceptible to being inadvertently activated. The protection circuit includes a capacitive element coupled between the second terminal and a compensating signal wherein the compensating signal changes substantially in the same manner as the signal coupled to the first terminal.

Also shown in an illustrated embodiment of the invention is a method for protecting a fusing element from being inadvertently changed from a first impedance state to a second impedance state. The fusing element has a first terminal coupled to a changeable signal, and the second terminal coupled, at least part of the time, to a reference potential through a capacitance so that the fusing element is susceptible to being inadvertently activated. A method of protection includes the steps of providing a compensating signal which changed substantially in the same manner as the signal coupled to the first terminal, and coupling the second terminal to the compensating signal.

Also shown in an illustrated embodiment of the invention is a memory array arranged in a matrix of rows of word lines and columns of bit lines with a memory bit at each intersection of a row and a column. Each memory bit includes a fusing element coupled between the bit line and the drain of an access transistor, the source of which is coupled to a reference potential and the gate of which is coupled to the word line. The memory bit also includes a capacitor coupled between the drain of the access transistor and the bit line.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 1:
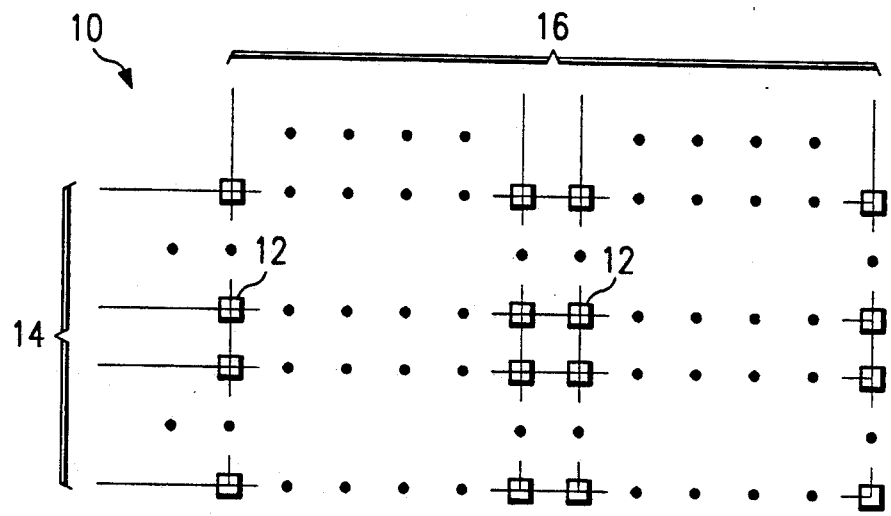
FIG. 1 is a block diagram of a memory array containing electrically programmable fuses and fuse protection circuits.

It will be appreciated that for purposes of clarity and where deemed appropriate, reference numerals have been repeated in the figures to indicate corresponding features.

DETAILED DESCRIPTION OF THE PREFERRED EMBODIMENT

A fuse protection circuit according to the preferred embodiment of the present invention consists of a capacitor coupled between the drain of an access transistor and the corresponding bitline for each bit in an electrically programmable fuse memory array. The fuse element, which in the preferred embodiment is an antifuse, is connected between the bitline and the drain of the access transistor with the gate of the access transistor connected to a wordline.

In an antifuse memory array an individual antifuse element is programmed by making the access transistor conductive and then applying a programming voltage, which may be on the order of 10 volts depending on the manufacturing process, onto the bit line which places the programming voltage across the antifuse. The programming voltage is sufficient to change the electrical characteristics of the antifuse from a relatively high resistance in parallel with a small capacitance to a relatively low resistance, on the order of less than 100 ohms depending on the manufacturing process, in parallel with the capacitance. During a read operation the enable transistor is made conductive and the bitline impedance is sensed to determine if the antifuse has been activated or not.

In this type of memory array the antifuse is susceptible to inadvertent activation because of the parasitic capacitance between the drain of the access transistor and ground. This parasitic capacitance can be much greater than the capacitance of the unactivated antifuse and can provide a virtual ground at the drain of the access transistor (even though the access transistor is not conductive). As a result, during the programming process when another antifuse on the same bitline is being programmed, the antifuse can be inadvertently activated. It has been found in some cases that the antifuse can be activated with as little as 10 microamps of current at 10 volts applied for a relatively short period of time, perhaps in as short a time as 20 nanoseconds, although the actual time is very difficult to measure.

The addition of a capacitor between the drain of the access transistor and the bitline causes the drain of the access transistor to follow the bitline voltage if the capacitance of the additional capacitor is much greater than the parasitic capacitance. This virtually eliminates any voltage differential across the antifuse when another bit on the same bitline is being programmed.

Turning now to the drawings, FIG. 1 is a block diagram of a memory array 10 consisting of a matrix of memory bit 12. The word lines 14 run horizontally in the array 10 and the bitlines 16 run vertically through the array 10. The operation of the array 10 is well known to those skilled in the art.

Figure 2:
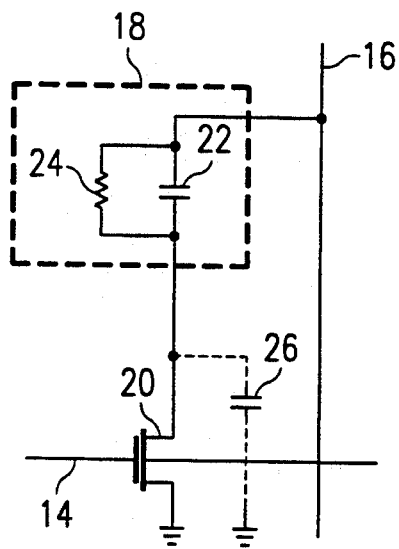
FIG. 2 is a schematic diagram of a electrically programmable bit without the fuse protection circuit of the present invention.

FIG. 2 is a schematic diagram of one of the individual memory bits 12 in a prior art antifuse memory array. The antifuse 18 has one terminal connected to the bitline 16 and a second terminal connected to the drain of an access transistor 20, the source of which is connected to ground. The gate of access transistor 20 is connected to the wordline 14. The antifuse 18 has electrical characteristics of a small capacitance 22 in parallel with a resistance 24. In the unprogrammed or initial impedance state, the antifuse resistance 24 is very large and the electrical characteristics of the antifuse are essentially those of the small capacitor 22. After the antifuse is activated, its impedance characteristics change to a second impedance state in which the resistance 24 changes from a very high resistance to a relatively small resistance, sometimes on the order of less than 100 ohms depending on the process used to manufacture the antifuse.

In a memory array containing antifuses manufactured with a current manufacturing process each antifuse is normally programmed or activated by applying a voltage of 10 volts to the wordline 14 which enables the access transistor 20, and by applying a voltage of 10 volts to the bitline 16. This action places 10 volts across the antifuse 18 which is sufficient to activate the antifuse 18. During normal read operations the wordline 14 is brought to +5 volts to make conductive the access transistor 20, then the impedance on the bitline 16 is sensed to determine if the antifuse 18 is activated or unactivated. Thus during a read or programming operation only one wordline 14 is enabled (placed at voltage above the threshold voltage of the access transistors 20) at one time.

Coupled between the drain of the access transistor 20 and ground is a parasitic capacitance 26 which consists mainly of the PN junction capacitance to substrate (or well) and the drain to gate overlap capacitance of device 20. The drain to gate overlap capacitance couples the drain to the gate, but when the memory cell is not being addressed, the gate of the access transistor 20 is held at ground potential thus providing a low impedance to ground. In practice, the parasitic capacitance 26 is much greater than the capacitance 22 of the antifuse 18. Therefore, when another bit connected to the same bitline 16 is being programmed, a signal of 10 volts is applied to the bitline 16 while the access transistor 20 is left nonconductive. However, the presence of the parasitic capacitance 26 causes the drain of the access transistor 20 to remain essentially at ground. Therefore during the initial application of the bit line signal a full 10 volts is applied across the antifuse 18 which may cause an inadvertent activation of the antifuse 18.

Figure 3:
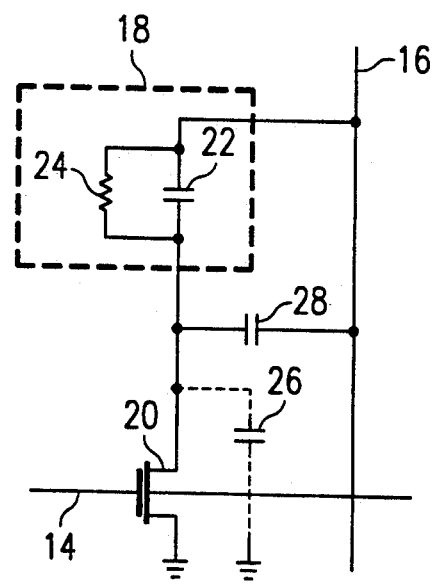
FIG. 3 is a schematic diagram of an electrically programmable fuse bit which includes the fuse protection circuit of the present invention.

The inadvertent activation of the antifuse 18 is prevented by an additional capacitor 28 shown in FIG. 3. The additional capacitor 28 is connected between the drain of the access transistor 20 and the bitline 16. In the preferred embodiment the capacitance of the capacitor 28 is made to be much greater than the parasitic capacitance 26. During voltage transitions on the bit line 16 the addition of the capacitor 28 causes the voltage at the drain of the transistor 20 to essentially follow the voltage on the bitline 16 when the access transistor 20 is nonconductive. Therefore, when another bit connected to the bitline 16 is being programmed, the antifuse 18 will have essentially a zero differential voltage across it and therefore will not be susceptible to being inadvertently activated.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teaching contained herein. For example, the capacitor 28 may be connected between the drain of the access transistor 20 and another signal in the memory array which has signal characteristics which are similar to the signal applied to the bitline 16 such that the differential voltage applied across the antifuse 18 is significantly less than the voltage differential required to program the antifuse 18 to thereby prevent inadvertent fusing or activating of the antifuse 18. Moreover, although the capacitance of the capacitor 28 in the preferred embodiment is much greater than the capacitance of the parasitic capacitor 26, the probability of inadvertent activating will be significantly reduced even if the capacitance of the capacitor 28 is approximately the same magnitude as the parasitic capacitor 26.

What is claimed is:

1. A protective circuit for protecting an electrically programmable element, said electrically programmable element having a first impedance state when manufactured which can be changed into a second impedance state, said electrically programmable element also having a first terminal coupled to a changeable signal and a second terminal wherein said electrically programmable element is susceptible to being inadvertently changed from said first impedance state to said second impedance state, said protection circuit comprising a capacitive element coupled between said second terminal and a compensating signal which changes substantially in the same manner as the signal coupled to said first terminal.

2. The protection circuit set forth in claim 1 wherein said compensating signal is the same signal as said changeable signal.

3. The protection circuit set forth in claim 1 wherein said second terminal is coupled, at least part of the time, to a reference potential through a capacitance, and the capacitance of said capacitive element is much greater than said capacitance between said second terminal and said reference potential.

4. A method for protecting an electrically programmable element from being inadvertently changed from a first impedance state to a second impedance state, said electrically programmable element having a first terminal coupled to a changeable signal and a second terminal coupled, at least part of the time, to a reference potential through a capacitance such that said electrically programmable element is susceptible to being inadvertently changed from said first impedance state to said second impedance state, said method comprises the steps of:
 a) providing a compensating signal which changes substantially in the same manner as the signal coupled to said first terminal; and
 b) capacitively coupling said second terminal to said compensating signal.

5. The method set forth in claim 4 wherein said compensating signal is the same signal as said changeable signal.

6. A memory array having a matrix of rows of word lines and columns of bit lines with memory bits at the intersections of each row and column, each of said memory bits comprising:
 a) an electrically programmable element coupled between said bit line and the drain of a transistor, the source of said transistor coupled to a reference potential, and the gate of said transistor coupled to said word line;
 b) a capacitor, separate from said electrically programmable element, coupled between the drain of said transistor and said bit line.

7. The protection circuit set forth in claim 1 wherein said electrically programmable element is an antifuse.

8. The protection circuit set forth in claim 1 wherein said electrically programmable element is part of a memory array.

* * * * *